United States Patent
Lee

(10) Patent No.: US 7,091,768 B2
(45) Date of Patent: Aug. 15, 2006

(54) CIRCUIT FOR CONTROLLING INTERNAL SUPPLY VOLTAGE DRIVER

(75) Inventor: Sang Kwon Lee, Yongin-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 74 days.

(21) Appl. No.: 10/879,876

(22) Filed: Jun. 29, 2004

(65) Prior Publication Data

US 2005/0122142 A1    Jun. 9, 2005

(30) Foreign Application Priority Data

Dec. 5, 2003    (KR)    ............... 10-2003-0088281

(51) Int. Cl.
*H01H 37/76*    (2006.01)

(52) U.S. Cl. .................. 327/525; 327/526; 365/225.7

(58) Field of Classification Search ............... 327/525, 327/526; 365/225.7
See application file for complete search history.

(56) References Cited

U.S. PATENT DOCUMENTS 5,602,771 A  *  2/1997  Kajigaya et al. ............ 365/51
6,388,935 B1     5/2002  Kawagoe et al.
6,426,653 B1     7/2002  Baker
6,529,419 B1     3/2003  Lee
6,809,975 B1  * 10/2004  Yamaoka et al. ........... 365/201
6,816,400 B1  * 11/2004  McClure .................... 365/145

FOREIGN PATENT DOCUMENTS

| JP | 10320996     | 12/1998 |
|----|--------------|---------|
| JP | 2000-315588  | 11/2000 |
| JP | 2002-203391  | 7/2002  |

* cited by examiner

*Primary Examiner*—Kenneth B. Wells
(74) *Attorney, Agent, or Firm*—Marshall, Gerstein & Borun LLP

(57) ABSTRACT

Provided is directed to an internal supply voltage driver control circuit which can vary a driver size by way of selecting a driver control signal by using a fuse cutout, and also decide an internal voltage by using fuses, by means of including: a plurality of drivers for outputting an internal voltage in response to a plurality of enable signals; and a control unit for selectively outputting one of the plurality of enable signals according to a combination of a test mode entry signal and a plurality of address signals, and then deciding a selected enable signal according to the fuse cutout.

16 Claims, 4 Drawing Sheets

CIRCUIT FOR CONTROLLING INTERNAL SUPPLY VOLTAGE DRIVER

This application relies for priority upon Korean Patent Application No. 2003-0088281 filed on Dec. 05, 2003, the contents of which are herein incorporated by reference in their entirety.

BACKGROUND

1. Field of the Invention

The present invention relates to an internal supply voltage driver control circuit, and more particularly to, an internal supply voltage driver control circuit capable of varying a driver size by selecting a driver control signal by using a test mode and also capable of deciding a final driver size by generating an enable signal by means of using a fuse block including a fuse and cutting a fuse when an optimum size is selected.

2. Discussion of Related Art

As FIG. 1 is a block diagram illustrating an internal supply voltage driver control circuit of the conventional art, a plurality of drivers 101 to 104 output an internal voltage according to a low level enable signal /en. However, the enable signal /en is inputted only to a driver 101 to 104 selected by operations of switches SW1 to SW4. For instance, the first to third drivers 101 to 103 are driven in response to inputting the low level enable signal /en by the first to third switches SW1 to SW3, but a fourth driver 104 is not driven by means of applying a high level external supply Vext by the fourth switch SW4.

However, in the conventional internal supply voltage driver control circuit as aforementioned, a driver size is controlled by means of controlling an input of the enable signal by using a switch, so that there is not other way to control a driver size except by using an external command. Therefore, an optimum driver size is only decided through a method of varying a driver size by means of directly modifying a circuit by using a focused ion beam FIB and then testing it again.

However, this method needs longer time to develop. Furthermore, the method is not efficient to obtain a stable internal voltage by supplying an optimum current to the device.

SUMMARY OF THE INVENTION

The present invention is directed to provide an internal supply voltage driver control circuit capable of solving the aforementioned problems, as being possible to vary a driver size by means of selecting a driver control signal by using a test mode.

Another object of the present invention is to provide an internal supply voltage driver control circuit capable of solving those problems as aforementioned, by way of generating an enable signal by using a fuse block including a fuse, and by way of deciding a final driver size by cutting a fuse when an optimum size is selected.

One aspect of the present invention is to provide an internal supply voltage driver control circuit which includes: a plurality of drivers which are enabled or disabled in response to a plurality of enable signals, with the respective plurality of drivers outputting an internal voltages when the respective drivers are enabled; and a control unit which includes fuses and operates in a test mode or a normal mode in response to a test mode entry signal, with the control unit outputting the plurality of enable signals for selectively or overall enabling the plurality of drivers in response to a plurality of address signals during the test mode and outputting the plurality of enable signals for selectively or overall enabling the plurality of drivers according to cutout of the fuses regardless of the plurality of address signals during the normal mode, wherein if the number of drivers being enabled is increased, current being supplied by the drivers is increased and if the number of drivers being enabled is decreased, current being supplied by the drivers is decreased.

Here, the control unit includes: a default fuse box having a first fuse to output signal, with the default fuse box outputting the first output signal as a fist logic level, regardless of the first fuse during the test mode and outputting the first output signal as the first logic level or a second logic level according to cutout of the first fuse during the normal mode; a plurality of fuse boxes each of which includes a second fuse to output a second output signal as the first or the second logic level in response to an address signal during the test mode and to output the second output signal as the first or the second logic level according to cutout of the second fuse, regardless of the address signal during the normal mode; a plurality of logic circuits each of which combines a drive enable signal and the first output signal of the default fuse box or the second output signal of the plurality of fuse boxes; and a coding circuit for generating the plurality of enable signals by coding output signals of the plurality of logic circuits.

The default fuse box includes: a level shifter for shifting a level of the test mode entry signal to a ground level or an external supply; a NAND gate for inverting an output signal of the level shifter according to a power-up signal; a first driver circuit for generating a third output signal in response to an output signal of the NAND gate; and a latch for latching the third output signal to generate the first output signal.

The first driver circuit includes: the first fuse connected between a external supply terminal and a first node a pull-up transistor connected between the first and a second nodes, with the pull-up transistor being driven by the output signal of the NAND gate; and a pull-down transistor connected between the second node and a ground terminal, with the pull-down transistor being driven by the output signal of the NAND gate.

Each of the plurality of fuse boxes includes: a first NAND gate for inputting the test mode entry signal and a plurality of address signals; a level shifter for shifting a level of an output signal of the first NAND gate to a ground level or an external supply; a second NAND gate for inverting an output signal of the level shifter according to a power-up signal; a second driver circuit for generating a fourth output in response to an output signal of the second NAND gate; and a latch for latching the fourth output signal to generate the second output signal.

The second driver circuit includes: the second fuse connected between a external supply terminal and a first node; a pull-up transistor connected between the first and a second nodes, which the pull-up transistor being driven by an output signal of the second NAND gate; and a pull-down transistor connected between the second node and a ground terminal, with the pull-down transistor being driven by the output signal of the second NAND gate.

Each of the plurality of logic circuits includes a NAND gate, and the coding circuit includes a plurality of NOR gates.

Furthermore, an internal supply voltage driver control circuit in accordance with another embodiment of the present invention includes: a default fuse box having a first fuse to output a first high level output signal in a normal mode and output a first low level output signal in a test mode and setting the first high level output signal or the first low level output signal according to the first fuse cutout; a plurality of fuse boxes, each of which includes a second fuse to output a second low level output signal in the normal mode, and controlling a second high level output signal or the second low level output signal according to an address signal in the test mode and setting the second high level output signal or the second low level output signal according to the second fuse cutout; a plurality of NAND gates each of which combines a driver enable signal and an output signals of the default fuse box and the plurality of fuse boxes; a plurality of inverters for inverting an output signals of the plurality of NAND gates, respectively; a plurality of NOR gates for generating and then outputting a plurality of enable signals by coding an output signals of the plurality of inverters; and a plurality of drivers for outputting a pluralit of the internal voltages according to the plurality of enable signals.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about embodiments of the present invention with reference to the accompanying drawings in detail.

Figure 1:
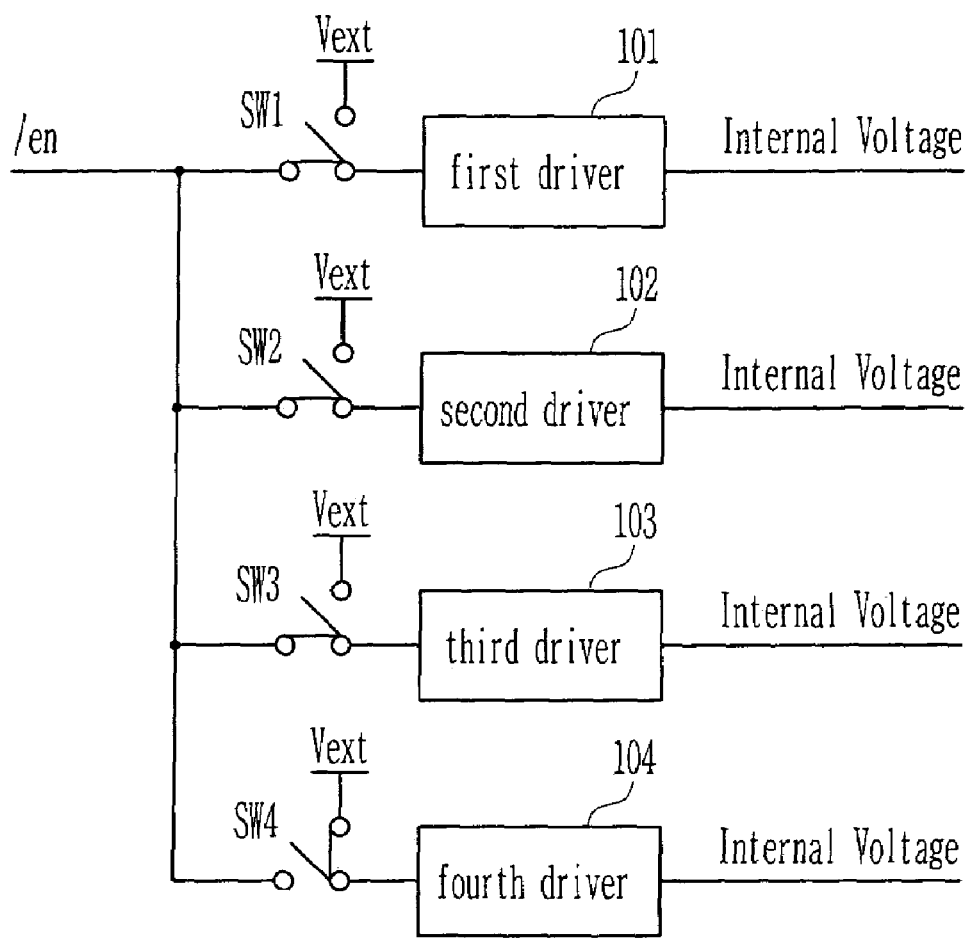
FIG. 1 is a block diagram illustrating an internal supply voltage driver control circuit of the conventional art.
Figure 2:
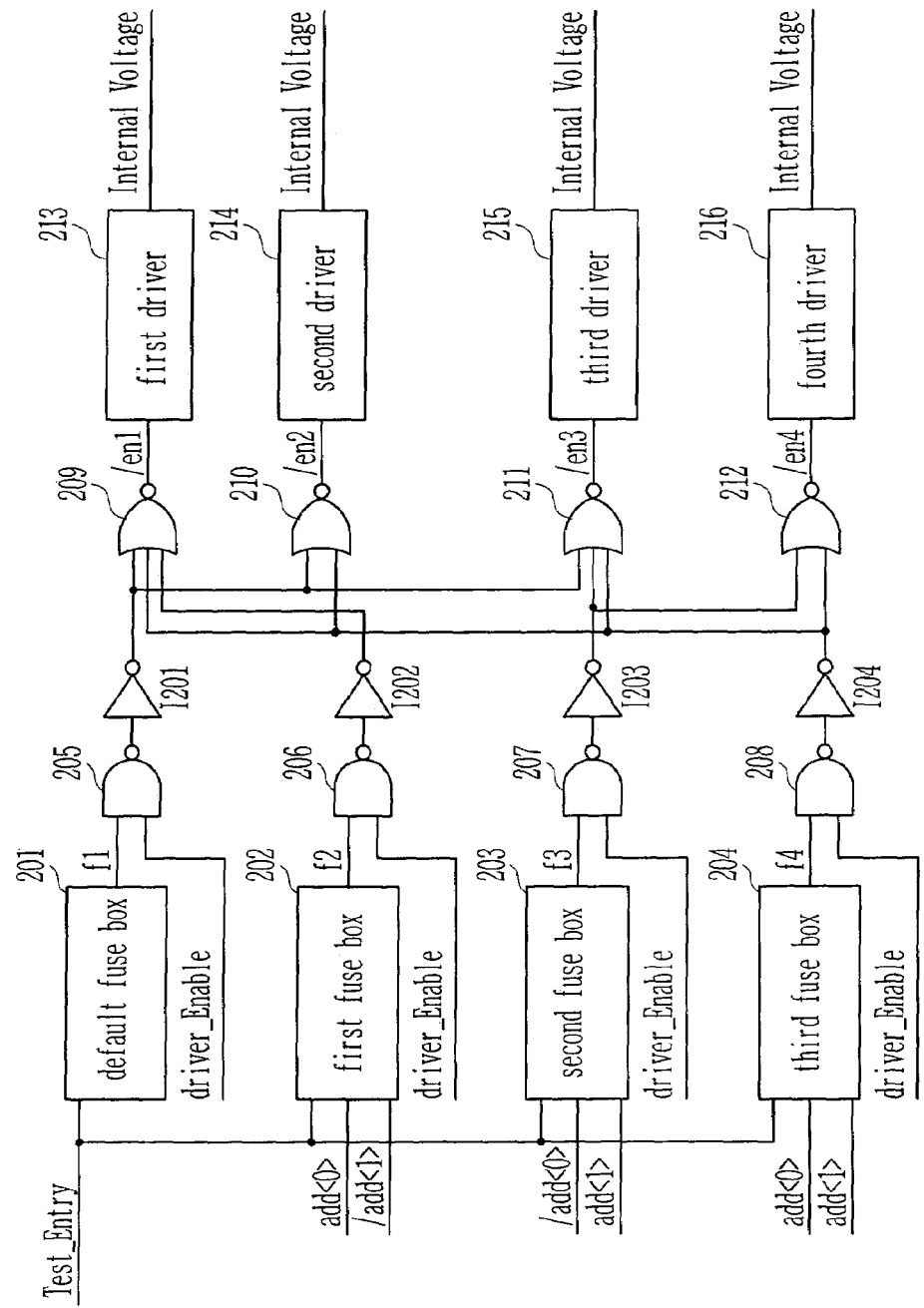
FIG. 2 is a block diagram illustrating an internal supply voltage driver control circuit in accordance with an embodiment of the present invention.

FIG. 2 is a block diagram illustrating an internal supply voltage driver control circuit in accordance with an embodiment of the present invention. The internal supply voltage driver control circuit in accordance with the present invention can vary a driver size by way of selecting a driver control signal by using a test mode, and then when an optimum driver size is selected, the final driver size is decided by cutting a fuse. It will be described about the configuration in detail as follows.

A default fuse box 201 including a fuse can output a predetermined output signal f1 according to a test mode entry signal Test_Entry and control the output signal f1 according to a fuse cutout. A plurality of fuse boxes 202 to 204 including a fuse, respectively, can control output signals f2 to f4 according to the test mode entry signal Test_Entry, and a combination of first and second address signals add<0>, add<1>, and also control the output signals f2 to f4 according to the fuse cutout. For instance, the first fuse box 202 including a fuse outputs the predetermined output signal f2 according to the test mode entry signal Test_Entry, the first address signal add<0>, and a second address bar signal /add<1>, and then can control the output signal f2 according to the fuse cutout. The second fuse box 203 including a fuse outputs the predetermined output signal f3 according to the test mode entry signal Test_Entry, a first address bar signal /add<0>, and the second address signal add<1>, and then can control the output signal f3 according to the fuse cutout. The third fuse box 204 including a fuse outputs the predetermined output signal f4 according to the test mode entry signal Test_Entry, and the first and second address signals add<0>, add<1>, and then can control the output signal f4 according to the fuse cutout.

A first NAND gate 205 outputs a predetermined signal by inputting the output signal f1 of the default fuse box 201 and a driver enable signal driver_enable. A first inverter I201 inverts an output signal of the first NAND gate 205. A second NAND gate 206 outputs a predetermined signal by inputting the output signal f2 of the first fuse box 202 and the driver enable signal driver_enable. A second inverter I202 inverts an output signal of the second NAND gate 206. A third NAND gate 207 outputs a predetermined signal by inputting the output signal f3 of the second fuse box 203 and the driver enable signal driver_enable. A third inverter I203 inverts an output signal of the third NAND gate 207. A fourth NAND gate 208 outputs a predetermined signal by inputting the output signal f4 of the third fuse box 204 and the driver enable signal driver_enable. A fourth inverter inverts an output signal of the fourth NAND gate 208.

A first NOR gate 209 outputs a first enable bar signal /en1 by inputting output signals of the first, second, and fourth inverters I201, I202, I204. A second NOR gate 210 outputs a second enable bar signal /en2 by inputting output signals of the first and fourth inverters I201, I204. A third NOR gate 211 outputs a third enable bar signal /en3 by inputting output signals of the first, third, and fourth inverters I201, I203, I204. A fourth NOR gate 212 outputs a fourth enable bar signal /en4 by inputting output signals of the third and fourth inverters I203, I204. Here, the first to fourth enable bar signals /en1 to /en4 are all low enable signals.

A first driver 213 outputs an internal voltage according to the first enable bar signal /en1. A second driver 214 outputs an internal voltage according to the second enable bar signal /en2. A third driver 215 outputs an internal voltage according to the third enable bar signal /en3. A fourth driver 216 outputs an internal voltage according to the fourth enable bar signal /en4.

It will now be explained of a method of driving the internal supply voltage driver control circuit in accordance with the present invention.

In case of operating in a normal mode, the test mode entry signal Test_Entry is inputted with a low state. Therefore, the default fuse box 201 outputs a high state output signal f1, and the first to third fuse boxes 202 to 204 output the low state output signals f2 to f4, respectively, regardless of the first and second address signals add<0>, add<1>. During this, when the driver enable signal driver_enable, an internal supply control signal, is applied with a high state, the first NAND gate 205 outputs a low state signal by inputting the output signal f1 of the default fuse box 201 and the driver enable signal driver_enable in a high state, and then the outputted signal is inverted by the first inverter I201. Moreover, the second to fourth NAND gates 206 to 208 output a high state signal by inputting the low state output signals f2 to f4 of the first to third fuse boxes, respectively, and the driver enable signal in a high state, and then the outputted signal is inverted by the second to fourth inverters I202 to I204. On the other hand, the output signals of the first to fourth inverters I201 to I204 are inputted by being combined in the first to fourth NOR gates 209 to 212. Accordingly, the first to third NOR gates 209 to 211 output the first to third enable bar signals /en1 to /en3 in a low state, and the fourth NOR gate outputs the fourth enable bar signal /en4 in a high state. As a result, the first to third drivers 213 to 215 are enabled, to output an internal voltage internal voltage thereto. On the other side, the fourth driver 216 is disabled, and thus it doesn't output the internal voltage internal voltage.

In case of operating in a test mode, when the test mode entry signal Test_Entry is applied with a high state, only the driver which is wanted to is enabled according to a combination of the address signals add<0>, add<1>. While this, when the first and second address signals add<0>, add<1> are applied with a high state, the default fuse box 201, and the first and second fuse boxes 202, 203 output the low state output signals f1, f2, f3 and the third fuse box 204 outputs the high state output signal f4. Furthermore, when the driver enable signal driver_enable is applied with a high state, the first to third NAND gates 205 to 207 output high state signals and the fourth NAND gate 208 outputs a low state signal. The output signals of the first to third NAND gates 205 to 207 are inverted to a low state through the first to third inverter I201 to I203 and the output signal of the fourth NAND gate 208 is inverted to a high state through the fourth inverter I204. Also, the output signals of the first to fourth inverters I201 to I204 are inputted by being combined in the first to fourth NOR gates 209 to 212. Accordingly, the first to fourth NOR gates 209 to 212 output the first to fourth enable bar signals /en1 to /en4 in a low state. As a result, the first to fourth drivers 213 to 216 are all enabled. In response to this, an internal voltage is outputted.

On the other side, in the operation of the test mode, when the test mode entry signal Test_Entry is applied to a high state, the first address signal add<0>is applied with a high state, and the second address signal add<1>is applied with a low state, the default fuse box 201, and the second and third fuse boxes 203, 204 output low state output signals f1, f3, f4 and the first fuse box 202 outputs the high state output signal f2. Moreover, when the driver enable signal driver-enable is applied with a high state, the first, third, and fourth NAND gates 205, 207, 208 output high state signals and the second NAND gate 206 outputs a low state signal. The output signals of the first, third, and fourth NAND gates 205, 207, 208 are inverted to a low state through the first, third and fourth inverters I201, I203, I204 and the output signal of the second NAND gate 206 is inverted to a high state through the second inverter I202. Additionally, the output signals of the first to fourth inverters I201 to I204 are inputted by being combined in the first to fourth NOR gates 209 to 212. Accordingly, only the second NOR gate 210 outputs the second enable signal /en2 in a low state. As a result, only the second NOR gate 210 is enabled, to output an internal voltage thereto. Therefore, current supplied to the first 213 to fourth 216 drivers is maximized.

As aforementioned, if the internal voltage is directly monitored with varying a driver size by changing a level of the address signals, it is capable of deciding an optimum internal voltage. Once the optimum internal voltage is set, a final setting is completed by cutting a fuse of the driver driven during this. On the other hand, if supposing to changing an initial setting value, it is possible to cut the fuse of the default fuse box 201 and to cut one of the rest of fuse boxes 202 to 204. For instance, in order to activate only two of the drivers, it is necessary to make the output signal f1 a low state by cutting the fuse of the default fuse box 201 and to make the output signal f3 a high state by cutting the fuse of the second fuse box 203. Contrarily, it is available to increase the number of addresses in order to subdivide a driver size a little more. Therefore, current supplied to the first 213 to fourth 216 drivers is minimized.

Furthermore, it will be described about configurations of the default fuse box 201 and fuse boxes 202 to 204 comprising the internal supply voltage driver control circuit in accordance with the present invention and a method of driving thereof, with reference to FIGS. 3 and 4.

Figure 3:
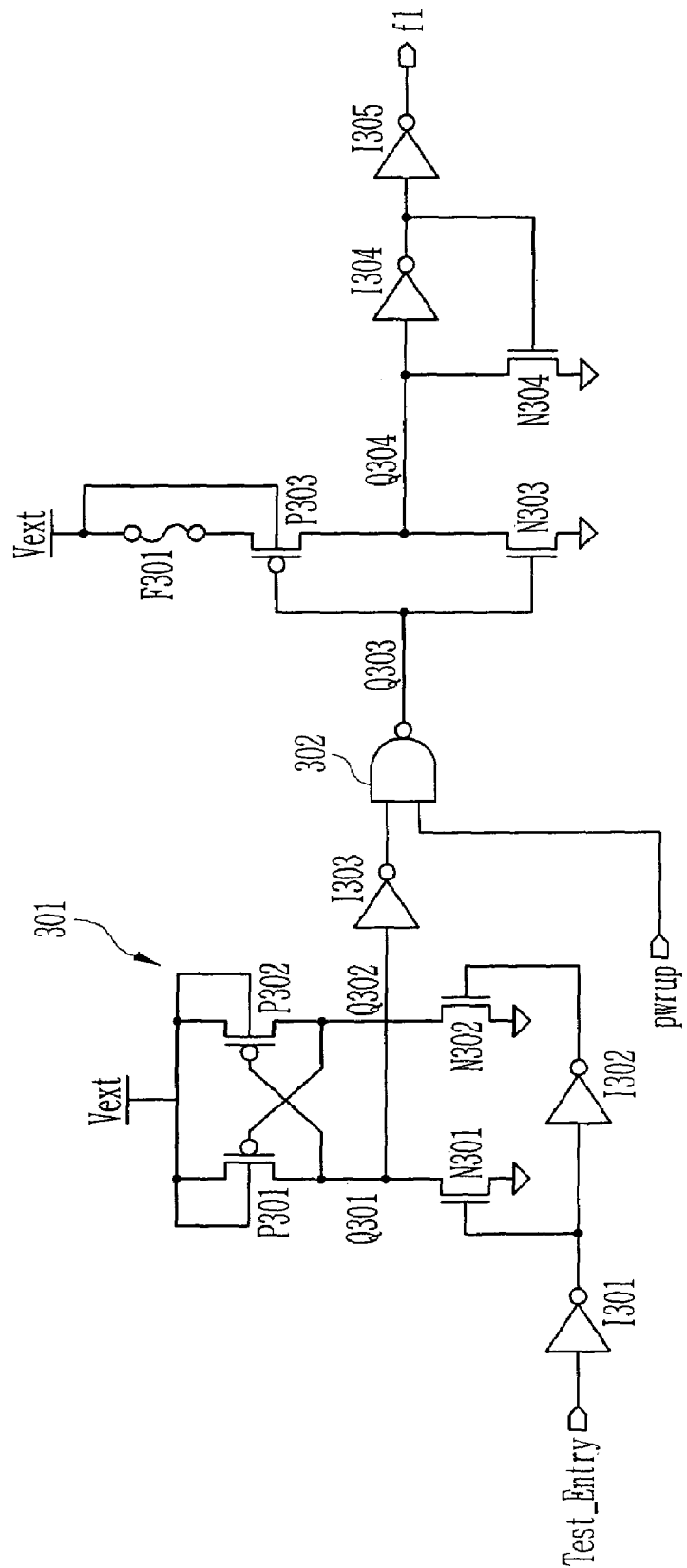
FIG. 3 is a circuit diagram illustrating an example of a default fuse box comprising an internal supply voltage driver control circuit in accordance with an embodiment of the present invention.

FIG. 3 is a circuit diagram illustrating the default fuse box comprising the internal supply voltage driver control circuit in accordance with the present invention.

A first inverter I301 inverts the test mode entry signal Test_Entry, and the second inverter I302 inverts an output signal of the first inverter I301. A level shifter 301 outputs an external supply Vext or a ground supply Vss according to the output signal of the first inverter I301. The level shifter 301 is comprised of: a first PMOS transistor P301 connected between the external supply Vext and a first node Q301 and driven by a potential of a second node Q302; a first NMOS transistor N301 connected between the first node Q301 and a ground terminal Vss and driven by the output signal of the first inverter I301; a second PMOS transistor P302 connected between the external supply Vext and the second node Q302 and driven by a potential of the first node Q301; and a second NMOS transistor N302 connected between the second node Q302 and the ground terminal Vss and driven by the output signal of the first inverter I301. On the other hand, the potential of the second node Q302 becomes an output of the level shifter 301. A third inverter I303 inverts the level shifter 301. A NAND gate 302 decides a potential of a third node Q303 by inputting the output signal of the level shifter 301 and a power-up signal pwrup. Here, the power-up signal pwrup is a signal for power up to set an initial value. That is, the power-up signal pwrup maintains a ground potential while a power supply is increased at the beginning, and maintains the same potential to the external supply when an external supply of a device is risen up to a constant voltage. A third PMOS transistor P303 and a third NMOS transistor N303 are alternatively driven by a potential of the third node Q303. In response to this, a potential of a fourth node Q304 is decided. The third PMOS transistor P303 is serially connected with a fuse F301 between the external supply Vext and the fourth node Q304 and the third NMOS transistor N303 is connected between the fourth node Q304 and the ground terminal Vss. The potential of the fourth node Q304 is outputted to an output terminal f1 through the fourth inverter I304 and the fifth inverter I305. On the other side, a fourth NMOS transistor N304 connected between the fourth node Q304 and the ground terminal Vss is driven by an output signal of the fourth inverter I304.

It will be explained of a method of driving the default fuse box according to the present invention constructed as aforementioned.

In a normal operation, the test mode entry signal Test_Entry is applied with a low state. The test mode entry signal Test_Entry applied with a low state is inverted to a high state by the first inverter I301 and also inverted to a low state by the second inverter I302. The level shifter 301 outputs a low state signal according to the high state output signal of the first inverter I301 and the low state output signal of the second inverter I302. The output signal of the level shifter 301 outputted with a low state is inverted to a high state by the third inverter I303. The high state output signal of the third inverter I303 and the power-up signal pwrup are inputted to the NAND gate 302, and then the NAND gate 302 outputs a low state signal. In response to this, the third node Q303 becomes a low state. The third PMOS transistor P303 is turned on and the third NMOS transistor N303 is turned off according to the potential of the third node Q303. Accordingly, the fourth node Q304 maintains a high state, and the high state output signal of the fourth node Q304 is outputted to the output terminal f1 through the fourth and fifth inverters I304, I305. On the other side, the fourth inverter I304 inverts the high state potential of the fourth node Q304 to a low state. As a result of this, the fourth NMOS transistor N304 is turned off.

Contrarily, in the test mode, the test mode entry signal Test_Entry is applied with a high state. The test mode entry signal Test_Entry applied with a high state is inverted to a low state through the first inverter I301 and then inverted to a high state through the second inverter I302. The level shifter 301 outputs a high state signal according to the low state output signal of the first inverter I301 and the high state output signal of the second inverter I302. The output signal of the level shifter 301 outputted with a high state is inverted to a low state by the third inverter I303. The low state output signal of the third inverter I303 and the power-up signal pwrup are inputted to the NAND gate N302, and the NAND gate 302 outputs a high state signal. In response to this, the third node Q303 becomes a high state. The third PMOS transistor P303 is turned off and the third NMOS transistor N303 is turned on, according to the high state potential of the third node Q303. Accordingly, the fourth node Q304 maintains a low state, and the low state output signal of the fourth node Q304 is outputted to the output terminal f1 through the fourth and fifth inverters I304, I305. On the other hand, as the fourth inverter I304 inverts the low state potential of the fourth node Q304 to a high state, the fourth NMOS transistor N304 is turned on. As a result, the fourth node Q304 maintains a low state by the fourth NMOS transistor N304 which has been turned on.

However, if the fuse F301 is cut off, the output terminal f1 maintains a low state.

Figure 4:
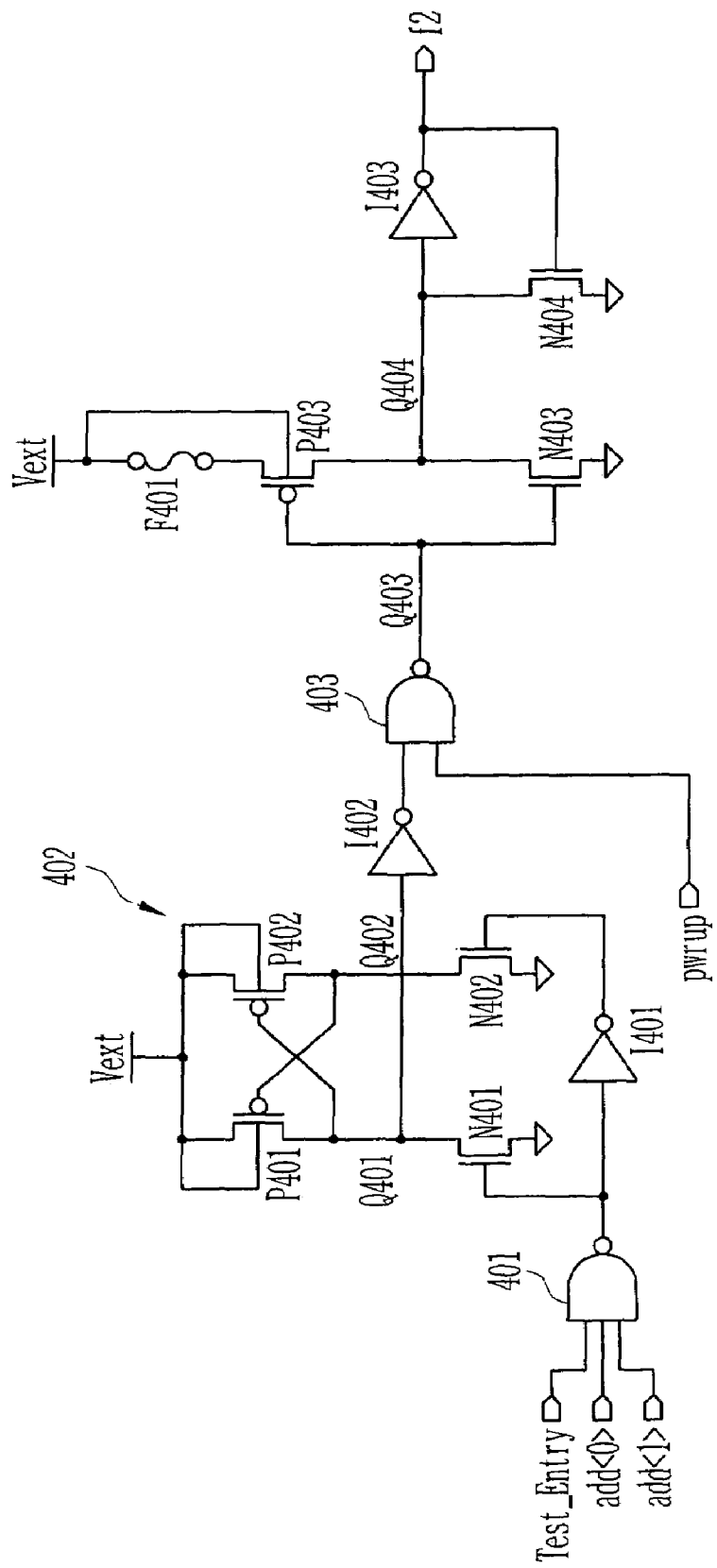
FIG. 4 is a circuit diagram illustrating an example of a fuse box comprising an internal supply voltage driver control circuit in accordance with an embodiment of the present invention.

FIG. 4 is a circuit diagram illustrating the fuse box comprising the internal supply voltage driver control signal in accordance with the present invention.

A first NAND gate 401 inputs the test mode entry signal Test_Entry, the first address signal add<0>, and the second address signal add<1>. A first inverter I401 inverts an output signal of the first NAND gate 401. A level shifter 402 outputs an external supply Vext and a ground supply Vss according to the output signal of the first NAND gate 401. The level shifter 402 is comprised of: a first PMOS transistor P401 connected between the external supply Vext and a first node Q401 and driven by a potential of a second node Q402; a first NMOS transistor N401 connected between the first node Q401 and a ground terminal Vss and driven by the output signal of the first NAND gate 401; a second PMOS transistor P402 connected between the external supply Vext and a second node Q402 and driven by a potential of the first node Q401; and a second NMOS transistor N402 connected between the second node Q402 and the ground terminal Vss and driven by the output signal of the first inverter I401. On the other hand, the potential of the first node Q401 becomes an output of the level shifter 402. A second inverter I402 inverts an output signal of the level shifter 402. A second NAND gate 403 decides a potential of a third node Q403 by inputting the output signal of the level shifter 402 and the power-up signal. Here, the power-up signal pwrup is a signal for power up to set an initial value. That is, the power-up signal pwrup maintains a ground potential while a power supply is rising at the beginning, and maintains the same potential to the external supply when an external supply Vext of a device is risen up to a target voltage. A third PMOS transistor P403 and a third NMOS transistor N403 are alternatively driven according to a potential of the third node Q403. In response to this, a potential of a fourth node Q404 is decided. The third PMOS transistor P403 is serially connected with a fuse F401 between the external supply Vext and the fourth node Q404 and the third NMOS transistor N403 is connected between the fourth node Q404 and the ground terminal Vss. The potential of the fourth node Q404 is inverted through the third inverter I403, and then outputted to an output terminal f2. On the other side, a fourth NMOS transistor N404 connected between the fourth node Q404 and the ground terminal Vss is driven by a potential of the output terminal f2.

It will now be explained of a method of driving the fuse box in accordance with the present invention constructed as aforementioned.

In a normal operation, the test mode entry signal Test_Entry is applied with a low state. The test mode entry signal Test_Entry applied with a low state is inputted to the first NAND gate 401 with the first and second address signals add<0>, add<1>, and then the first NAND gate 401 outputs a high state signal. The high state signal of the first NAND gate 401 is inverted to a low state by the first inverter I401. The level shifter 402 outputs a low state signal according to the high state output signal of the first NAND gate 401 and the low state output signal of the first inverter I301. The output signal of the level shifter 402 outputted with a low state is inverted to a high state by the second inverter I402. The high state output signal of the second inverter I402 and the power-up signal pwrup are inputted to the second NAND gate 403 and the second NAND gate 403 outputs a low state signal. In response to this, the third node Q403 becomes a low state. The third PMOS transistor P403 is turned on and the third NMOS transistor N403 is turned off, according to the low state potential of the third node Q403. Accordingly, the fourth node Q404 maintains a high state, and the high state output signal of the fourth node Q404 is inverted to a low state through the third inverter I403. As a result, the low state output signal of the fourth node Q404 is outputted to the output terminal f2. On the other hand, as the output terminal f2 is a low state, the fourth NMOS transistor N404 is turned off.

Contrarily, in the test mode, the test mode entry signal Test_Entry is applied with a high state. The test mode entry signal Test_Entry applied with a high state is inputted to the first NAND gate 401 with the first and second address signals add<0>, add<1>. The output signal of first NAND gate 401 is decided by the first and second address signals add<0>, add<1>. In this moment, if assuming that the first and second address signals add<0>, add<1>are applied with a high state, the output signal of the first NAND gate 401 is outputted as a low state signal. The low state output signal of the first NAND gate 401 is inverted to a high state through the first inverter I401. The level shifter 402 outputs a high state signal according to the low state output signal of the first NAND gate 401 and the high state output signal of the first inverter I401. The high state output signal of the level shifter 402 is inverted to a low state by the second inverter I402. The low state output signal of the second inverter I402 and the power-up signal pwrup are inputted to the second NAND gate 403, and the second NAND gate 403 outputs a high state signal. In response to this, the third node Q403 becomes a high state. The third PMOS transistor P403 is turned off and the third NMOS transistor N403 is turned on, according to the high state potential of the third node Q403. Accordingly, the fourth node Q404 maintains a low state, and the low state output signal of the fourth node Q404 is inverted to a high state through the third inverter I403. In response to this, the output terminal f2 becomes a high state. Moreover, the fourth NMOS transistor N404 is turned on according to the high state potential of the output terminal f2. As a result, the fourth node Q404 maintains a low state according to the fourth NMOS transistor N404 which has been turned on. However, the potential of the output terminal f2 maintains a low state, if at least more than one of the first and second address signals add<0>, add<1> is applied with a low state.

On the other hand, if the fuse F401 is cut off, the output terminal maintains a high state.

As described earlier, it has been capable of adjusting a voltage driver size by FIB in the conventional art. However, as the present invention can control it by using the test mode, it leads efficiency for analyzing defect, which result in decrease of development time. Moreover, because it is possible to control the size by entering the test mode, if using an oscilloscope, it is also advantageous to extract a voltage driver size capable of maintaining the most stabilized voltage level with controlling the size in a real time. Furthermore, it is advantageous to reduce development cost because of using a fuse without changing a mask to vary the driver size.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. An internal supply voltage driver control circuit, comprising:
   a plurality of drivers which are enabled or disabled in response to a plurality of enable signals, with the respective drivers outputting a plurality of internal voltages when the respective drivers are enabled for; and
   a control unit which includes fuses and operates in a test mode or a normal mode in response to a test mode entry signal, with the control unit outputting the plurality of enable signals for selectively or overall enabling the plurality of drivers in response to a plurality of address signals during the test mode and outputting the plurality of enable signals for selectively or overall enabling the plurality of drivers according to cutout of the fuses regardless of the plurality of address signals during the normal mode,
   wherein if the number of drivers being enabled is increased, current supplied by the drivers is increased, and if the number of drivers being enabled is decreased, current supplied by the drivers is decreased.

2. The internal supply voltage driver control circuit of claim 1, wherein the control unit includes:
   a default fuse box having a first fuse to output a first output signal, with the default fuse box outputting the first output signal as a first logic level, regardless of the first fuse during the test mode and outputting the first output signal as the first logic level or a second logic level according to cutout of the first fuse during the normal mode;
   a plurality of fuse boxes each of which includes a second fuse to output a second output signal as the first or the second logic level in response to an address signal during the test mode and to output the second output signal as the first or the second logic level according to cutout of the second fuse, regardless of the address signal during the normal mode;
   a plurality of logic circuits each of which combines a drive enable signal and the first output signal of the default fuse box or the second output signal of the plurality of fuse boxes; and
   a coding circuit for generating the plurality of enable signals by coding output signals of the plurality of logic circuits.

3. The internal supply voltage driver control circuit of claim 2, wherein the default fuse box includes:
   a level shifter for shifting a level of the test mode entry signal to a ground level or an external supply;
   a NAND gate for inverting an output signal of the level shifter according to a power-up signal;
   a first driver circuit for generating a third output signal in response to an output signal of the NAND gate; and
   a latch for latching the third output signal to generate the first output signal.

4. The internal supply driver circuit of claim 3, wherein the first driver circuit includes:
   the first fuse connected between an external supply terminal and a first node;
   a pull-up transistor connected between the first node and a second node, with the pull-up transistor being driven by the output signal of the NAND gate; and
   a pull-down transistor connected between the second node and a ground terminal, with the pull-down transistor being driven by the output signal of the NAND gate.

5. The internal supply voltage driver control circuit of claim 2, wherein each of the plurality of fuse boxes includes:
   a first NAND gate for inputting the test mode entry signal and the plurality of address signals;
   a level shifter for shifting a level of an output signal of the first NAND gate to a ground level or an external supply;
   a second NAND gate for inverting an output signal of the level shifter according to a power-up signal;
   a second driver circuit for generating a fourth output signal in response to an output signal of the second NAND gate; and
   a latch for latching the fourth output signal to generate the second output signal.

6. The internal supply voltage driver control circuit of claim 5, wherein the second driver circuit includes:
   the second fuse connected between an external supply terminal and a first node;
   a pull-up transistor connected between the first node and a second node, with the pull-up transistor being driven by the output signal of the second NAND gate; and
   a pull-down transistor connected between the second node and a ground terminal, with the pull-down transistor being driven by the output signal of the second NAND gate.

7. The internal supply voltage driver control circuit of claim 2, wherein each of the plurality of logic circuits includes a NAND gate.

8. The internal supply voltage driver control circuit of claim 2, further including a plurality of NOR gates.

9. An internal supply voltage driver control circuit, comprising:
   a default fuse box having a first fuse to output a first high level output signal in a normal mode and output a first low level output signal in a test mode and set the first high level output signal or the first low level output signal according to a first fuse cutout;

a plurality of fuse boxes, each of which includes a second fuse to output a second low level output signal in the normal mode and control a second high level output signal or the second low level output signal according to address signals in the test mode and set the second high level output signal or the second low level output signal according to a second fuse cutout;

a plurality of NAND gates each of which combines a driver enable signal and an output signal of the default fuse box and the plurality of fuse boxes;

a plurality of inverters for inverting a plurality of output signals of the plurality of NAND gates, respectively;

a plurality of NOR gates for generating and then outputting a plurality of enable signals by coding an output signals of the plurality of inverters; and a plurality of drivers for outputting a plurality of the internal voltages according to the plurality of enable signals.

10. An internal supply voltage driver control circuit, comprising:

a plurality of drivers for outputting a plurality of internal voltages in response to a plurality of enable signals; and a default fuse box having a first fuse capable of outputting a first predetermined output signal according to a test mode entry signal and setting a first output signal according to a first fuse cutout;

a plurality of fuse boxes having fuses capable of each outputting a signal according to a signal combining the test mode entry signal and the plurality of address signals, respectively, and setting each output signal according to a cutout of the fuses;

a plurality of logic circuits for outputting the output signal of the default fuse box and the plurality of fuse boxes according to a driver enable signal; and a coding circuit for generating the plurality of enable signals by coding output signals of the plurality of logic circuits.

11. The internal supply voltage driver control circuit of claim 10, wherein the default fuse box includes:

a level shifter for shifting a level of the test mode entry signal to a ground level or an external supply;

a NAND gate for inverting and then outputting an output signal of the level shifter according to a power-up signal;

a first driver circuit for pulling up or pulling down a potential of a first node according to an output signal of the NAND gate; and a latch for latching the potential of the first node when it is a low level.

12. The interval supply driver circuit of claim 11, wherein the first driver circuit includes:

the first fuse connected between a power supply terminal and a second node;

a pull-up transistor connected between the first and second nodes and driven by the output of the NAND gate; and a pull-down transistor connected between the first node and a ground terminal and driven by the output of the NAND gate.

13. The internal supply voltage driver control circuit of claim 10, wherein each of the plurality of fuse boxes includes:

a first NAND gate for inputting the test mode entry signal and the plurality of address signals;

a level shifter for shifting a level of an output signal of the first NAND gate to a ground level or an external supply;

a second NAND gate for inverting and then outputting an output signal of the level shifter according to a power-up signal;

a second driver circuit for pulling up or pulling down a potential of a first node according to an output signal of the second NAND gate; and a latch for latching the potential of the first node when it is a low level.

14. The internal supply voltage driver control circuit of claim 13, wherein the second driver circuit includes:

the fuses connected between a power supply terminal and a second node;

a pull-up transistor connected between the first and second nodes and driven by the output of the second NAND gate; and a pull-down transistor connected between the first node and a ground terminal and driven by the output of the second NAND gate.

15. The internal supply voltage driver control circuit of claim 10, wherein each of the plurality of logic circuits is a NAND gate.

16. The internal supply voltage driver control circuit of claim 10, wherein the coding circuit is a NOR gate.

* * * * *

UNITED STATES PATENT AND TRADEMARK OFFICE
CERTIFICATE OF CORRECTION

PATENT NO. : 7,091,768 B2 Page 1 of 1
APPLICATION NO. : 10/879876
DATED : August 15, 2006
INVENTOR(S) : Sang K. Lee It is certified that error appears in the above-identified patent and that said Letters Patent is hereby corrected as shown below:

In Claim 12, line 3, please delete "interval" and insert --internal--

Signed and Sealed this

Twenty-third Day of January, 2007

JON W. DUDAS
*Director of the United States Patent and Trademark Office*